US005419462A

United States Patent [19]

Johnston et al.

[11] Patent Number: 5,419,462

[45] Date of Patent: May 30, 1995

[54] APPARATUS FOR RECHARGING A HEATED RECEPTACLE WITH PARTICULATE MATTER AT A CONTROLLED VELOCITY

[75] Inventors: Steven W. Johnston, Seabrook, Tex.; Andrew O. Wikman, Baton Rouge, La.

[73] Assignee: Albemarle Corporation, Richmond, Va.

[21] Appl. No.: 179,410

[22] Filed: Jan. 10, 1994

Related U.S. Application Data

[63] Continuation-in-part of Ser. No. 942,948, Sep. 9, 1992, abandoned.

[51] Int. Cl.[6] .......... B67D 5/06

[52] U.S. Cl. .......... 222/183; 222/185; 222/462; 222/509; 222/523; 222/525

[58] Field of Search .......... 222/162, 183, 185, 460, 222/462, 509, 522, 523, 525

[56] References Cited

U.S. PATENT DOCUMENTS 293,898 2/1884 Martin .
1,234,710 7/1917 Adams .
1,795,986 3/1931 Adams .
1,795,988 3/1931 Adams .
1,795,989 3/1931 Adams .
2,634,842 4/1953 Caylor .......... 193/32
2,892,739 6/1959 Rusler .......... 148/1.5
3,265,469 8/1966 Hall .......... 23/273
4,203,951 5/1980 Goriletsky et al. .......... 422/249
4,265,859 5/1981 Jewett .......... 422/199
4,269,652 5/1981 Yancey .......... 156/607
4,330,362 5/1982 Zulehner .......... 156/617 SP
4,379,021 4/1983 Damen et al. .......... 156/616 R
4,505,407 3/1985 Johnson et al. .......... 222/523 X
4,911,895 3/1990 Kida et al. .......... 422/245
5,009,863 4/1991 Shima et al. .......... 422/249
5,016,683 5/1991 Latka .......... 141/1
5,037,503 8/1991 Kajimoto et al. .......... 156/620.1
5,080,873 1/1992 Ono et al. .......... 422/249
5,108,720 4/1992 Bourbina et al. .......... 422/253
5,152,433 10/1992 Mohri .......... 222/183 X
5,170,729 12/1992 Benner .......... 222/509 X

FOREIGN PATENT DOCUMENTS

0170856A1 2/1986 European Pat. Off. .
0206555A1 12/1986 European Pat. Off. .
0450494A1 10/1991 European Pat. Off. .
319466 3/1920 Germany .
784617 10/1957 United Kingdom .
371154 5/1973 U.S.S.R. .......... 222/525
8606764 11/1986 WIPO .

*Primary Examiner*—Andres Kashnikow
*Assistant Examiner*—Joseph A. Kaufman
*Attorney, Agent, or Firm*—Edgar E. Spielman, Jr.

[57] ABSTRACT

Particle scattering and/or trapping in the feed of particulate matter into a receptacle can be avoided by the use of a particulate matter-dispensing apparatus comprising telescopically-aligned internal and external robes associated with an actuator for telescopic movement of the tubes; the tubes having inner surfaces which are free of any protrusion or recession capable of preventing telescopic movement of the tubes or permitting the resting of particulate matter within the tubes, and the external tube having a distal orifice which is sufficiently smaller than its bore to decrease the flow rate of particulate matter through the tube. The novel apparatus is particularly useful for the discontinuous feeding of particulate polysilicon into a melting crucible.

5 Claims, 3 Drawing Sheets

APPARATUS FOR RECHARGING A HEATED RECEPTACLE WITH PARTICULATE MATTER AT A CONTROLLED VELOCITY

CROSS-REFERENCE TO RELATED APPLICATION

This application is a continuation-in-part of application Ser. No. 07/942,948, filed Sep. 9, 1992, now abandoned.

FIELD OF INVENTION

The invention relates to an apparatus for controllably feeding particulate matter into a heated receptacle. More particularly, it relates to such an apparatus suitable for recharging a melting crucible with particulate polysilicon.

BACKGROUND

When particulate matter is fed into a receptacle, it is frequently desirable to utilize conduits which permit gravitational flow into the crucible, protect the particulate matter from contamination by the environment, and are preferably formed of materials such that at least their inner surfaces are non-contaminating to the particulate matter. Such conduits have been used, e.g., in feeding particulate polysilicon into a melting crucible in the Czochralski method of manufacturing monocrystalline silicon from molten silicon—the preferred non-contaminating materials for these conduits usually being silicon, quartz, silicon-on-quartz, or silicon-on-graphite.

A major disadvantage of known devices for feeding particulate matter into receptacles is usually apt to be their permitting gravitationally-flowing particles to leave the conduits at considerable speed. This is likely to cause serious problems in processes such as the feeding of particulate polysilicon into a melting crucible, both when the crucible already contains a molten mass and when it does not.

When particulate polysilicon is added at normal falling velocity to a crucible containing a molten mass, there is a danger of splashing or excessive production of ripples or eddies within the mass; and ripple formation in the subsequently-formed molten mass can also be caused by the fast addition of the particulate matter to a crucible which does not already contain a melt at the time of the addition. This can happen because some of the particles, when striking one another or the crucible, can bounce up, become situated above the basin of the crucible, and later fall into the molten silicon—creating a tippling effect which disrupts formation of the desired silicon crystal.

Other problems that can be caused by the scattering of particles are that (1) the scattered particles may accumulate contaminants, such as silicon monoxide, which they will bring with them to the molten mass of silicon and (2) the scattering of the particles may cause particulate matter to locate in other areas of the silicon melting/crystal pulling apparatus used in a Czochralski system and damage or block the functioning of the apparatus.

As disclosed in U.S. Pat. No. 5,080,873 (Ono et al.), various feed tubes have been designed to permit feeding particulate polysilicon into a melting crucible at a controlled rate. These feed tubes provide advantages over the conduits which include no means of reducing the velocity of the falling particles, but they do not constitute a really satisfactory means of accomplishing the feed. Not only do they allow the initial flow of particles to exit at excessive velocities, but their static-position design necessitates their being positioned near the edge of the crucible to prevent them from obstructing crystal growth at the center. Moreover:

(1) several of these feed tubes could also allow particles to become lodged therein (especially when the flow path into the crucible is not vertical)—creating a source of particles to become dislodged and fall into or around the crucible during crystal growth, and (2) the positioning of the tubes to encourage preheating of the particles therein would create another potential hazard to the crystal growth environment if the feeding and heating were interrupted, since the preheating could cause polysilicon granules to fuse, adhere to the inner surfaces of the tubes until cooled, and then break away and fall into the crucible.

Other means of feeding particulate polysilicon into a melting crucible are known, of course, including the apparatus of U.S. Pat. No. 5,152,433 (Mohri). However, these means also fail to provide a really satisfactory way of accomplishing the feed, both because of not exerting sufficient control of the flow rate and because of having the distal portion of the feed tube in a fixed position that prevents its being easily withdrawn for repair or for allowing unobstructed crystal growth at the center of the crucible if it were located so as to permit feeding the particles into the optimum location for recharge of the crucible, i.e., near the center.

It would be desirable to find a means of controlling the velocity of the flow of particles exiting a feed tube in a manner such that (1) the flow rate would be reduced both initially and subsequently during the feed, (2) particles would not be allowed to become trapped in the feeding means, and (3) the feed tube could be lowered into a melting crucible or the like and then withdrawn so as to:

(a) permit feeding the particles at the optimum central location for recharge of the crucible without providing an obstruction for crystal growth at that location, (b) minimize the particle preheating and fusion that can be caused by extension of the feed tube into the crucible, and (c) thus avoid the environmental contamination that would be caused if fused particles were allowed to form and then break away during withdrawal of the tube.

Such a means would permit avoiding the aforementioned problems associated with known means of feeding particulate polysilicon into a melting crucible, as well as similar problems encountered in known methods of feeding other particulate matter into heated receptacles; and it would provide an apparatus suitable for use in discontinuous feeding, i.e., recharge operations, rather than the continuous feeding for which the Ono et al. and Mohri feeding means are designed.

SUMMARY OF INVENTION

It has been found that particle scattering and/or trapping in the feed of particulate matter into a receptacle can be avoided by the use as the feeding device of a particulate matter-dispensing apparatus suitable for use in recharging a melting crucible and comprising telescopically-aligned internal and external tubes associated with an actuator for telescopic movement of the tubes; said tubes having inner surfaces which are free of any protrusion or recession capable of preventing telescopic movement of the tubes or permitting the resting of particulate matter within the tubes, and said external tube having a distal orifice which is sufficiently smaller than its bore to decrease the flow rate of particulate matter through the tube.

DETAILED DESCRIPTION

Figure 1:
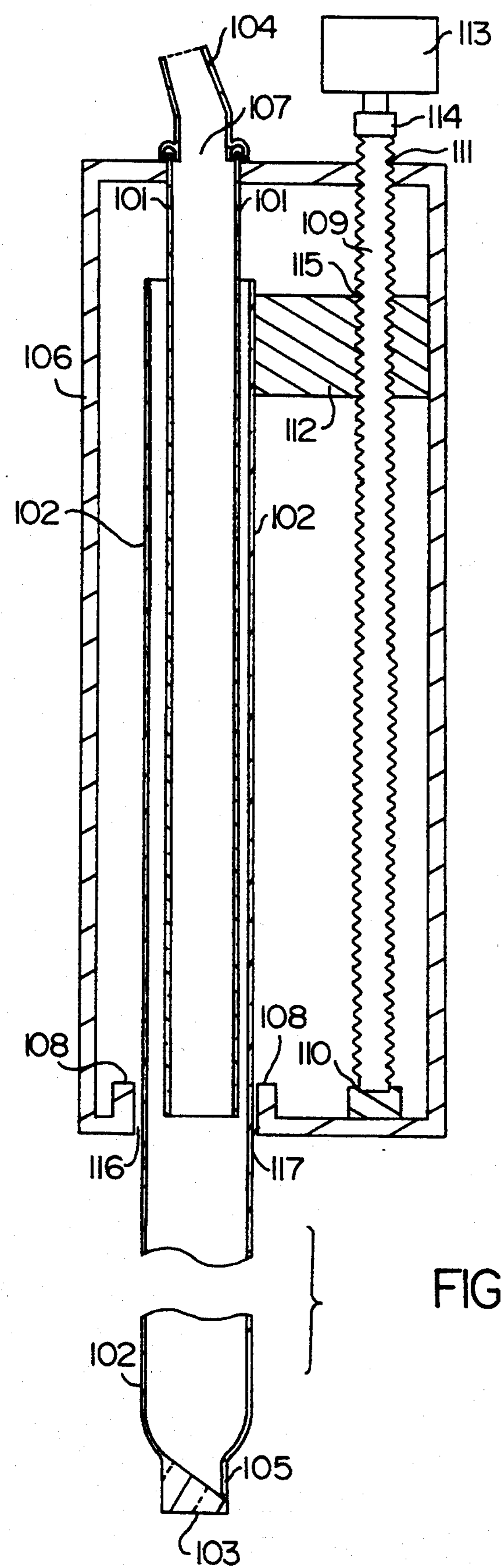
FIG. 1 is a vertical, cross-sectional view of one embodiment of the particulate matter-feeding apparatus of the invention.

Referring to FIG. 1, a particulate matter-dispensing apparatus of the invention has an internal tube 101 and an external tube 102 arranged telescopically so that the flow path of particulate matter through the tubes may be extended by an actuator to the desired location for depositing the particulates. Further extension of the flow path is achieved when the apparatus includes one or more additional tubes (not shown) in telescopic arrangement with tubes 101 and 102. These tubes usually have a cylindrical structure but may have any other geometric configuration which permits telescopic movement of the tubes and prevents the resting of particulate matter within the tubes.

External tube 102 has a distal orifice 105 which is sufficiently smaller than the bore of the tube to decrease the flow rate of particulate matter through the tubes without providing any resting place for the particles.

The apparatus of FIG. 1 has a housing 106 into which the internal tube may be secured at its proximal end 107 and which incorporates a guiding means 117 to limit and direct the passage of external tube 102 as it is extended from the housing to the receptacle (not shown) below.

External tube 102 may be extended from the housing and retracted by the use of an actuator, which may be any actuator means capable of effecting telescopic movement of the tubes under the conditions to which the apparatus will be subjected. In FIG. 1, the actuator comprises (A) a threaded rod 109 secured by means 110 and 111 in such a way as to allow it to be rotated along its longitudinal axis, (B) a threaded coupling means 112 laterally attached to external tube 102 and including a threaded chamber 115 which closely corresponds to and accepts passage of threaded rod 109, and (C) a means 113 for rotating threaded rod 109.

Instead of comprising the stationary supporting means 110 and an encircling opening 111 in housing 106, the means for securing threaded rod 109 may be any other means which maintains the longitudinal axis of the rod in the desired position and permits rotation of the rod with a consequent action on chamber 115 of threaded coupling means 112 which causes the coupling means to be moved upward or downward, thus allowing for controlled retraction or extension of external tube 102.

The means for rotating the threaded rod may be an electrical/mechanical means 113 (such as an electric motor) which is secured to threaded rod 109 by a standard coupling means 114 as illustrated in FIG. 1. However, any number of mechanical or manual rotating means could be used instead. It is normally preferred for the rotating means to be automated but to have a manual override in case of need.

The guiding means 117 illustrated in FIG. 1 comprises a means which corresponds to the outer boundaries of opening 116 in housing 106, encircles external tube 102, and controls lateral movement of that tube. This guiding means may be allowed to contact the tube as long as that contact does not restrict the extension and retraction of the tube.

The portion of the guiding means which contacts the external tube may be a portion 117 of housing 106 itself, or it may be a girdling means 108 located on the contact surfaces of the guiding means. When used, the girdling means may be composed of a material which is the same as or different from the material of the housing, provided that it is made of a material which will not be degraded when the apparatus is used and thus provide a source of contamination to the particulate matter.

When the apparatus of FIG. 1 is used, it may be fed by any suitable source of particulate matter. The immediate source 104 of the particulate matter does not constitute a portion of the present invention but is located above the apparatus and preferably comprises a means of controlling the amount of material flowing into internal tube 101. Such a means may be a valve, such as an angle of repose valve, that merely controls the gravitational flow of particles into the internal tube, or it may comprise any number of dose-controlling means. It is preferred that the means be capable of allowing a continual, gravitational flow of particulate matter into the internal tube; and it is also preferred that this means have a size such that the inner dimensions of internal tube 101 provide the only limitation to the amount of particulate matter entering and flowing through the tube.

Passing the maximum amount of particulate matter from the beginning of operation provides two advantages. First, it allows for a faster completion of the step of charging the crucible or other receptacle. Secondly, and more importantly, the passage of a large amount of particulate matter through the tubes creates a dynamic accumulation of particulates against the blocking means 103 located at the distal end of external tube 102. This dynamic accumulation allows for a significantly controlled particle velocity and rate of flow, as discussed below with regard to FIG. 2.

In the operation of the apparatus of FIG. 1, particulate matter enters internal tube 101 at its proximal end 107 and travels downward through the tubes before exiting through the distal orifice 105 of external tube 102.

It is highly preferred for the tubes, or at least the inner surfaces of the tubes, to be made of a material which will be non-contaminating to the particulate matter for which they will serve as a conduit—quartz, e.g., being a preferred construction material when the particulate matter is polysilicon. Also, when desired, the inner surfaces of the tubes may be lined or coated with a material (e.g., silicon, silicon carbide, or silica when the particulate matter is polysilicon) to diminish the contaminating possibilities still further. However, it is sometimes not enough to limit the construction, lining, and coating materials to ones that are normally suitable for contact with the particulate material: It may also be necessary to avoid the use of thermally sensitive materials.

Even though the apparatus of the invention is free of heating means, and intentional heating of the tubes is avoided to prevent sticking of hot granules to the tubes, the use of the apparatus in feeding a particulate material to a hot receptacle can lead to unintentional heating of the distal end of external tube. Thus, e.g., when the apparatus is to be used to feed particulate polysilicon into a melting crucible, and the distal end of the external tube will be extended into an area where temperatures approach or exceed the melting point of silicon, it would be impractical to employ a thermally-sensitive silicon or silicon carbide coating or lining. Silica would be much preferred as the coating or lining material in such a situation; and white opaque silica is particularly preferred because of its reflecting radiant heat and thus preventing heating of the granules in the tube.

In the interest of further protecting the particulate material from contamination, it may be necessary or desirable to use additional equipment to maintain a non-contaminating atmosphere—frequently argon or helium in particulate polysilicon processes. Such equipment, which may include gas-tight seals at piping connections and conventional bellows to enclose more open or moving portions of the related equipment, can be the equipment conventionally used for this purpose; and its use removes any necessity for having a gas-tight seal between guiding means 117 and external tube 102 when a non-contaminating atmosphere must be maintained.

The present invention provides a means of introducing the particulate matter into a container at any desired location or angle by spatially maneuvering or securing housing 106 so that external tube 102 is correctly directed. Particulate matter may be delivered at any angle which allows for the gravitational flow of particles through the internal and external tubes. As already indicated, this is particularly advantageous in the preferred embodiment wherein the apparatus is used to recharge a heated receptacle, such as a melting crucible, since it permits delivering the particles to the optimum location near the center of the crucible when desired. A more thorough view of embodiments of the invention relating to the distal end of the external tube, i.e., the end from which the particulate matter exits into the container, can be seen in FIGS. 2–5.

Figure 2:
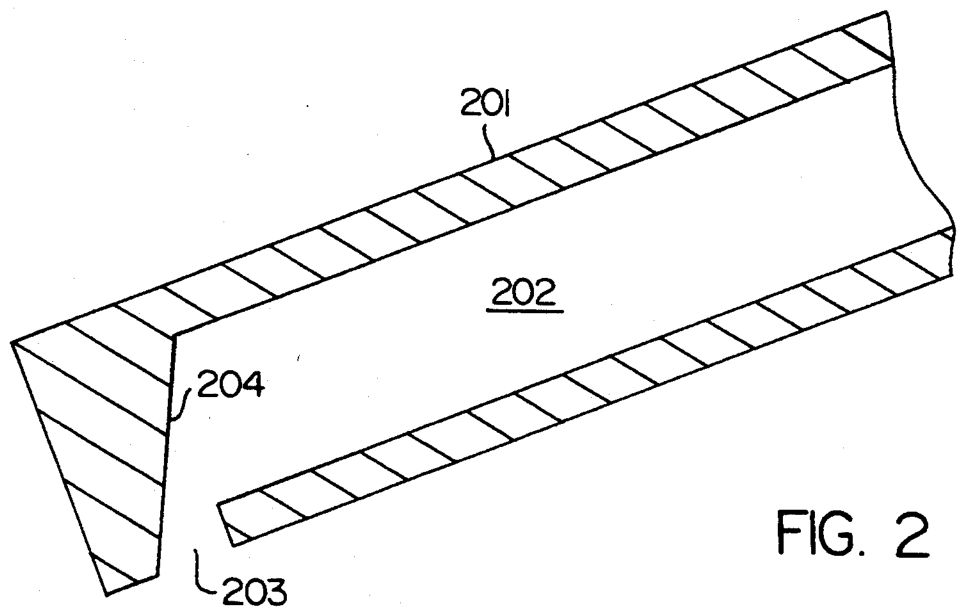
FIGS. 2–5 are cross-sectional views of the distal end of the external feed tube in four different embodiments of the invention.

FIG. 2 is a cross-section of the distal end of external tube 201, which directs the gravitational flow of particulates through central chamber 202 toward one or more (preferably one) exit orifices 203 which are smaller than the bore of tube 201 (i.e., have dimensions such that at least one dimension is smaller than the bore of tube 201) and thus slow the velocity of the particles by causing the tube to be full of moving granules. For simplicity, such exit orifices are sometimes referred to as limited openings herein.

Angled blocking means 204 located at the most distal end of external tube 201 provides two general functions, the first of which is to diminish the velocity of the moving particles by extending into their flow path, thus reducing the force with which the particles will strike the receptacle or its solid or molten contents. The second of these functions is to direct the flow of particles toward limited opening 203 by being angled toward the opening.

Although it is desirable to employ a blocking means having a surface angle sufficient to slow the flow of particles, it is important that the surface angle be insufficient to allow particles to (1) build up to a natural angle of repose, thus possibly stemming the particle flow altogether, or (2) remain stagnant on the surface, thus providing trapped particles which could be dislodged as the tube is withdrawn and fall into the receptacle from an undesirable height or angle.

The use of the blocking means and limited opening(s) permits the flow of particles from the external tube to be controlled regardless of the rate at which they are fed into the tube. When a relatively small number of particles is passed through the external tube, their gravitationally-induced speed is relatively fast; but the blocking means serves to block their passage and direct them at reduced speed through the limited opening(s). When a larger number of particles is allowed to build up and form a dynamic mass of particles in central chamber 202 (as is usually preferred), the angle of the blocking means facilitates their steady motion toward the limited opening(s).

In a preferred embodiment of the invention, the external tube has a limited opening located in its side adjacent to the lower end of the blocking means. This insures that the particles strike the blocking surface before exiting the tube, since the limited opening is thus out of the straight-line flow path which the particulates would follow during normal bore flow.

Figure 3:
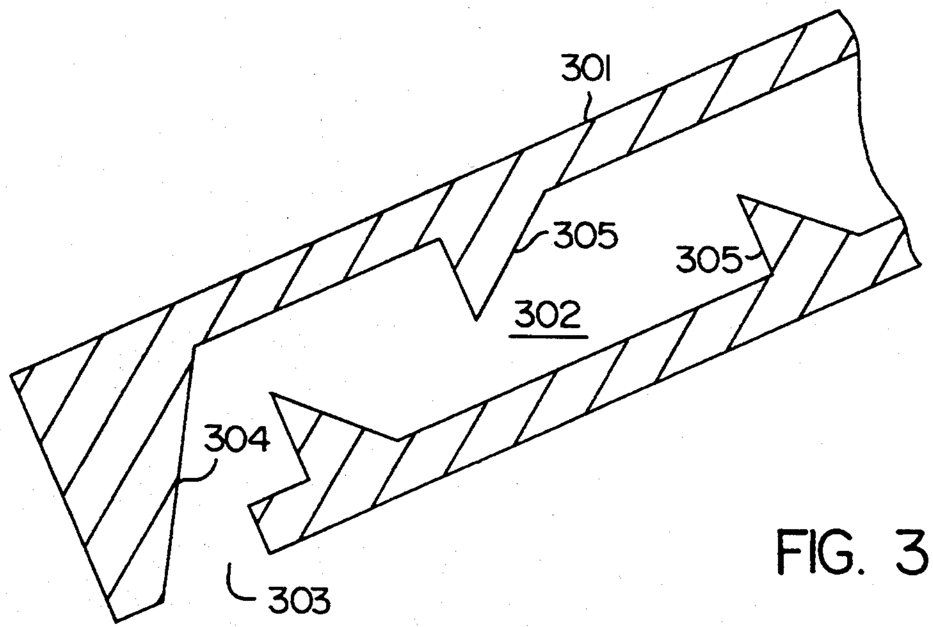

The embodiment of the invention illustrated in FIG. 3 is similar to that shown in FIG. 2 except for including a series of baffles 305 extending from the inner surface of external tube 301 into central chamber 302 above blocking means 304 and limited opening 303. These baffles, when used, impinge into the path of particles flowing through the tube and can provide a further reduction in the flow rate by having their surfaces angled so that at least some of the particles will collide with them and be directed into contact with the next baffle in the series. By themselves, these baffles would provide no greater a reduction in the flow rate than is provided by the baffles of Ono et al.; but they can have value when used in conjunction with the improved flow rate-reducing means of the present invention.

As already indicated, any baffles provided on the inner surfaces of the internal or external tube cannot have a size or angle such that they would constitute protrusions capable of preventing the telescopic movement of the internal and external tubes or permitting the resting of particulate matter within the tubes. However, within those limitations, they can be used in the external tube, as illustrated in FIG. 3, and can also be used in the internal tube if desired. When employed, the baffles should be made of a material which is non-contaminating to the particulate matter and is resistant to being abraded when contacted with the particles. Silica is a particularly good material to use when the particulate matter is polysilicon.

Figure 4:
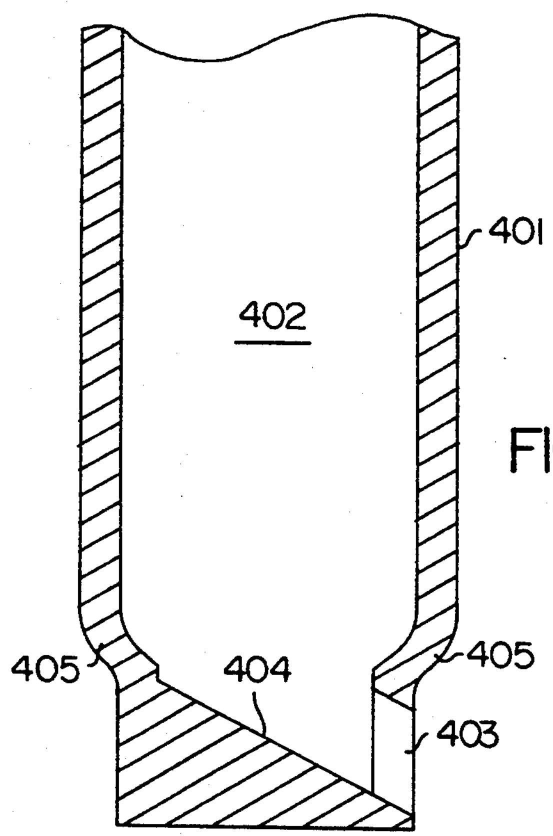

FIG. 4 illustrates an embodiment of the invention in which the inner diameter of external tube 401 is reduced so as to restrict the flow path 402 of the particulate matter prior to its contacting angled blocking surface 404 and then exiting through limited opening 403. The reduction may be effected by a simple funneling 405 of the external tube or by any other means which diminishes flow path 402 without causing particulate matter to become lodged in the tube.

Figure 5:
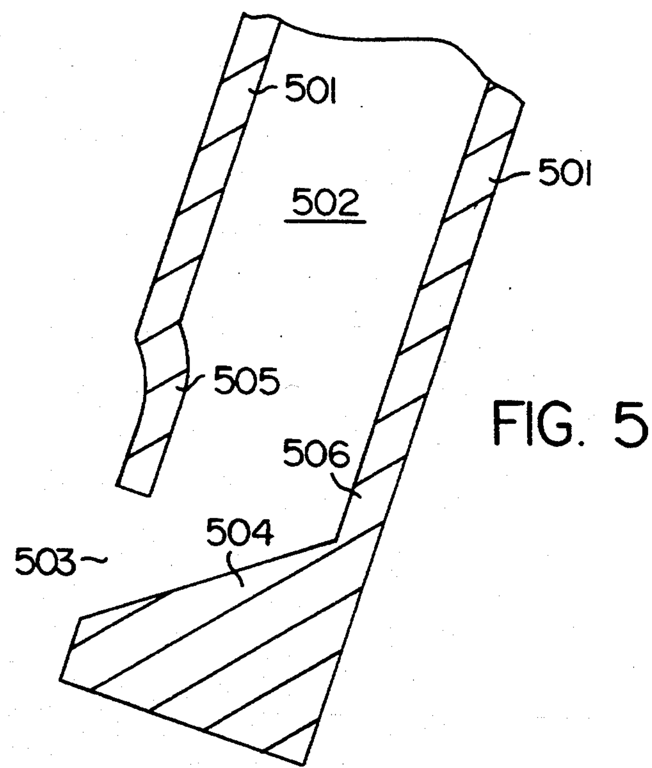

The embodiment of the invention illustrated in FIG. 5 is similar to that shown in FIG. 4 in that flow path 502 of the particulate matter is restricted prior to its contacting angled blocking surface 504 and then exiting through limited opening 503, and this restriction is effected by reducing the inner diameter of external tube 501. However, in this embodiment, only a portion 505 of the tube is funneled; and the inner surface 506 of the tube which meets the surface of blocking means 504 is not funneled, crimped, impinged, or otherwise introduced further into the flow path. This is beneficial when the external tube must be introduced into the receptacle at an angle considerably removed from the vertical, since flow surface 506 facilitates particle flow and does not allow particles to rest or become trapped in any recess of the feed tube. Though diminished in velocity, the mass of particulate matter remains dynamic: The design of the apparatus does not allow for stagnant accumulation of particles.

As indicated by the foregoing, the dimensions of the feed tubes may be altered to accomodate various forms and sizes of particulate matter as long as the aforementioned functions are served. When the particulate matter is polysilicon in which the particles have a mean diameter of ~0.7 mm and a maximum size of ~3 mm, it is preferred that the external feed tube have an inner diameter of ≧15 mm—this being the inner diameter at the more restricted portion of the tube when there is any funneling or other reduction in the inner diameter, as in FIGS. 4 and 5. There does not appear to be any functional limitation on the maximum diameter of the tube.

The size of the limited opening can also be altered to accomodate various sizes of particles and various desired flow rates, and its shape may also be varied. A relatively square opening has been found to work well, and such an opening having an area of ~180 $mm^2$ gives particularly good results in conjunction with the ≧15 mm-diameter external tube mentioned above when dispensing polysilicon particles having a mean diameter of ~0.7 mm and a maximum size of ~3 mm. Actually, the only serious considerations that must be given to the size and shape of the limited openings is that they be such as to decrease the rate of flow without allowing particles to rest or become trapped In the distal end of the external feed tube.

Although variations may also be made in the angle above the horizontal at which the blocking surface is fixed, it should be remembered that too small an angle can provide a surface on which particles might rest, while too large an angle could decrease the ability of the blocking surface to decrease the rate of flow. Angles of 30°-60° can provide satisfactory results, but an angle of ~45° is usually apt to be preferred. When the particulate matter is polysilicon, which has a natural angle of repose of ~30°, it can be important to avoid the use of blocking surface angles of ≦30° above the horizontal.

What is claimed is:

1. An apparatus suitable for use in recharging a melting crucible with particulate polysilicon, said apparatus comprising: telescopically-aligned internal and external tubes associated with an actuator for telescopic movement of the tubes, said tubes having inner surfaces which are free of any protrusions and rescissions capable of preventing telescopic movement of the tubes and permitting the resting of particulate matter within the tubes, and said external tube having (i) a distal orifice which is sufficiently smaller than its bore to decrease the flow rate of particulate matter through the tube and (ii) a blocking surface located at the distal end of the external tube and angled downwardly toward the distal orifice to decrease the velocity of the flowing particles and to direct this flow toward the orifice, the horizontal angle of the blocking surface being such so as to effect a dynamic accumulation of and attenuate a static accumulation of the particulate polysilicon in the external tube.

2. The apparatus of claim 1 wherein the inner diameter of the external tube is smaller immediately above the blocking surface than it is distally of the blocking surface.

3. The apparatus of claim 1 wherein the horizontal angle of the blocking surface is 30°-60° above the horizontal.

4. The apparatus of claim 3 wherein the horizontal angle is ~45° above the horizontal.

5. The apparatus of claim 3 wherein the horizontal angle of the blocking surface is ~45° above the horizontal and the inner diameter of the external tube is smaller immediately above the blocking surface than it is distally of the blocking surface.

* * * * *